United States Patent
She et al.

(10) Patent No.: US 11,282,682 B2
(45) Date of Patent: Mar. 22, 2022

(54) MAGNETRON DRIVE MECHANISM, MAGNETRON ASSEMBLY AND REACTION CHAMBER

(71) Applicant: BEIJING NAURA MICROELECTRONICS EQUIPMENT CO., LTD., Beijing (CN)

(72) Inventors: Qing She, Beijing (CN); Jingfeng Wei, Beijing (CN); Mengxin Zhao, Beijing (CN); Jue Hou, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 70 days.

(21) Appl. No.: 16/611,068

(22) PCT Filed: Apr. 28, 2018

(86) PCT No.: PCT/CN2018/085059
§ 371 (c)(1),
(2) Date: Nov. 5, 2019

(87) PCT Pub. No.: WO2018/210120
PCT Pub. Date: Nov. 22, 2018

(65) Prior Publication Data
US 2020/0203135 A1 Jun. 25, 2020

(30) Foreign Application Priority Data

May 18, 2017 (CN) .......................... 201710354815.3

(51) Int. Cl.
*H01J 37/34* (2006.01)
*C23C 14/35* (2006.01)

(52) U.S. Cl.
CPC .......... *H01J 37/3455* (2013.01); *C23C 14/35* (2013.01); *H01J 37/3405* (2013.01)

(58) Field of Classification Search
CPC .... H01J 37/3455; H01J 37/3405; H01J 37/34; C23C 14/35; C23C 14/3407; B25J 9/101
See application file for complete search history.

(56) References Cited

U.S. PATENT DOCUMENTS 6,228,236 B1 * 5/2001 Rosenstein ......... H01J 37/3408
134/1.1
2003/0217913 A1 11/2003 Hong et al.
(Continued)

FOREIGN PATENT DOCUMENTS

| CN | 1669111 A | 9/2005 |
| CN | 1890399 A | 1/2007 |

(Continued)

OTHER PUBLICATIONS

World Intellectual Property Organization (WIPO) International Search Report for PCT/CN2018/085059 dated Jul. 16, 2018 6 Pages.

*Primary Examiner* — Jennifer Wecker
*Assistant Examiner* — Patrick S Ott
(74) *Attorney, Agent, or Firm* — Anova Law Group, PLLC

(57) ABSTRACT

A magnetron drive mechanism is provided. The magnetron drive mechanism includes: a driving assembly, a rotating assembly, a transmission assembly, and a limiting assembly. The driving assembly is configured to drive the rotating assembly and the transmission assembly to rotate clockwise or counterclockwise around a first rotation axis. The rotating assembly is connected to a magnetron, and through the transmission assembly, the driving assembly drives the rotating assembly and the magnetron to rotate clockwise or counterclockwise around a second rotation axis. The second rotation axis and the first rotation axis are parallel with each
(Continued)

other. The limiting assembly is configured to block the rotating assembly from rotating clockwise or counterclockwise, respectively, to confine the magnetron to positions at different radii of the first rotation axis. The present disclosure also provides a magnetron assembly and a reaction chamber.

18 Claims, 3 Drawing Sheets

(56) References Cited

U.S. PATENT DOCUMENTS

| | | | | |
|---|---|---|---|---|
| 2003/0217914 | A1* | 11/2003 | Miller | H01J 37/3455 |
| | | | | 204/192.12 |
| 2005/0211548 | A1* | 9/2005 | Gung | H01J 37/3408 |
| | | | | 204/192.12 |
| 2008/0099329 | A1* | 5/2008 | Pavloff | H01J 37/3408 |
| | | | | 204/298.16 |
| 2009/0139854 | A1* | 6/2009 | Chang | H01J 37/3455 |
| | | | | 204/192.13 |
| 2014/0060235 | A1* | 3/2014 | Ootani | B25J 9/101 |
| | | | | 74/490.05 |

FOREIGN PATENT DOCUMENTS

| | | |
|---|---|---|
| CN | 1914351 A | 2/2007 |
| CN | 101195906 A | 6/2008 |
| CN | 206902227 U | 1/2018 |

* cited by examiner

MAGNETRON DRIVE MECHANISM, MAGNETRON ASSEMBLY AND REACTION CHAMBER

CROSS-REFERENCES TO RELATED APPLICATIONS

This application is a national phase entry under 35 U.S.C. § 371 of International Application No. PCT/CN2018/085059, filed on Apr. 28, 2018, which claims the priority of Chinese Patent Application No. 201710354815.3, filed with the State Intellectual Property Office of P. R. China on May 18, 2017, the entire contents of which are incorporated herein by reference.

BACKGROUND

In a sputtering apparatus, a plasma is generated in a chamber, and positive ions in the plasma are attracted by the cathode to blast a target material in the chamber to cause atoms of the target material to be knocked out and deposited onto a wafer. Currently, a magnetron is added on the back side of the target material to bind the electrons in the plasma to the surface of the target material. As such, movement time of the electrons is increased to increase the chance of electrons colliding with a gas to be ionized to obtain a high-density plasma and to improve a deposition rate. At the same time, to uniformly deposit the sputtered particles on the surface of the wafer, the magnetron is often driven by an electric motor to rotate relative to the center of the target material.

In recent years, with the development of the technology, it is possible to deposit thin films on sidewalls of high aspect ratio holes. One of widely used technologies is a self-ionized plasma (SIP) deposition technology. In this technology, a small portion of the sputtered particles are adsorbed to deep holes. FIG. 1 illustrates a schematic view of a typical self-ionizing sputtering chamber. Referring to FIG. 1, the reaction chamber includes an upper chamber 11 and a lower chamber 12. A target material 111 is disposed at the bottom of the top wall of the upper chamber 11, and an insulating housing 112 is disposed above the top wall of the upper chamber 11. The insulating housing 112 is filled with deionized water 113, and a magnetron 114 is located in the deionized water 113. Moreover, the magnetron 114 is driven by an electric motor 115 to rotate around the central axis of the target material 111. An electrostatic chuck 121 for carrying the wafer is disposed in the lower chamber 12, and a vacuum system 122 is disposed at the bottom of the lower chamber 12 for changing the vacuum pressure of the chamber.

In practical applications, if only a peripheral region of the target material is corroded, re-deposition may occur in an uncorroded inner region of the target material. To prevent the re-deposited particles from peeling off the surface of the target material and affecting the internal environment of the chamber, the sputtering process needs to be performed in two steps. In a first step, the magnetron rotates in the peripheral region of the target material to complete the deposition on the wafer. In a second step, the magnetron rotates in the inner region of the target material to complete the process of cleaning the target material.

In the existing technology, the magnetron is switched between the peripheral region of the target material and the inner region of the target material by controlling a rotation speed of the electric motor. Specifically, when the electric motor drives the magnetron to rotate at a certain high rotation speed, the magnetron may overcome an elastic force of a spring to move to the peripheral region of the target material under the action of a centrifugal force. When the electric motor drives the magnetron to rotate at a certain low rotation speed, the magnetron may move to the center of the target material under the elastic force of the spring until the magnetron enters the inner region of the target material.

However, the above magnetron assembly has the following problems in practical applications.

First, the magnetron has a limited movement range, and there are strict requirements for the shape and size of the magnetron. Thus, the deposition process is substantially limited by these constraints.

Second, the switching of the magnetron between the peripheral region and the inner region of the target material is achieved under the action of the combined force of the centrifugal force at different rotation speeds of the electric motor, the elastic force of the spring, and the fluid pressure of the deionized water. There are too many factors, which make the adjustment too complicated. For example, if the fluid pressure of the deionized water changes, the centrifugal force or the elastic force needs to be adjusted accordingly to maintain the same combined force. But it requires the adjustment of the electric motor speed or the replacement of the spring, thereby increasing the process difficulty.

BRIEF SUMMARY OF THE DISCLOSURE

The objective of the present disclosure is to solve one or more technical problems in the existing technology. The magnetron drive mechanism, the magnetron assembly, and the reaction chamber provided by the embodiments of the present disclosure are neither limited by the shape and size of the magnetron nor affected by factors such as a centrifugal force, an elastic force of a spring, a liquid pressure of deionized water, etc. Thus, the reliability is improved, and the process difficulty is reduced.

One aspect of the present disclosure provides a magnetron drive mechanism. The magnetron drive mechanism includes: a driving assembly, a transmission assembly, a rotating assembly, and a limiting assembly, wherein, the driving assembly is configured to drive the rotating assembly and the transmission assembly to rotate clockwise or counterclockwise around a first rotation axis;

the rotating assembly is connected to a magnetron, and through the transmission assembly, the driving assembly drives the rotating assembly and the magnetron to rotate clockwise or counterclockwise around a second rotation axis, the second rotation axis and the first rotation axis being parallel with each other; and the limiting assembly is configured to block the rotating assembly from rotating clockwise or counterclockwise to confine the magnetron to positions at different radii of the first rotation axis.

Optionally, the driving assembly includes a drive source, a first rotating shaft, and a first rotating arm, wherein:

the first rotating shaft and the first rotating arm are connected;

the transmission assembly and the rotating assembly are fixed to the first rotating arm;

the drive source drives the first rotating shaft and the first rotating arm to rotate clockwise or counterclockwise around the first rotation axis; and the first rotating shaft is connected to the rotating assembly through the transmission assembly.

Optionally, the rotating assembly includes a second rotating shaft and a second rotating arm;

the first rotating shaft is connected to the second rotating shaft through the transmission assembly, when the first rotating shaft rotates clockwise or counterclockwise, the second rotating shaft rotates clockwise or counterclockwise around the second rotation axis; and the second rotating arm and the second rotating shaft are connected and the magnetron is fixed to the second rotating arm.

Optionally, the limiting assembly includes a first limiting member and a second limiting member disposed on the second rotating arm;

when the drive source drives the first rotating shaft to rotate clockwise, the first limiting member contacts with the first rotating arm to block the second rotating arm from continuing to rotate when the magnetron rotates clockwise to a position at a first radius of the first rotation axis; and when the drive source drives the first rotating shaft to rotate counterclockwise, the second limiting member contacts with the first rotating arm to block the second rotating arm from continuing to rotate when the magnetron rotates counterclockwise to a position at a second radius of the first rotation axis.

Optionally, the limiting assembly further includes a third limiting member disposed on the first rotating arm; when the drive source drives the first rotating shaft to rotate clockwise, the first limiting member contacts with the third limiting member to block the second rotating arm from continuing to rotate when the magnetron rotates clockwise to the position at the first radius of the first rotation axis; and when the drive source drives the first rotating shaft to rotate counterclockwise, the second limiting member contacts with the third limiting member to block the second rotating arm from continuing to rotate when the magnetron rotates counterclockwise to the position at the second radius of the first rotation axis.

Optionally, the limiting assembly further includes a first position adjustment device and a second position adjustment device; the first position adjustment device is configured to adjust the position of the first limiting member and/or the second limiting member on the second rotating arm; and the second position adjustment device is configured to adjust the position of the third limiting member on the first rotating arm.

Optionally, the transmission assembly includes a first pulley, a second pulley, and a synchronous belt;
the first pulley is mounted on the first rotating shaft;
the second pulley is mounted on the second rotating shaft; and
the synchronous belt is sleeved on the first pulley and the second pulley.

Optionally, the transmission assembly includes a first gear, a second gear, and a third gear;
the first gear is mounted on the first rotating shaft;
the third gear is mounted on the second rotating shaft; and
the second gear meshes with the first gear and the third gear.

Optionally, the magnetron drive mechanism further includes: a sealed housing configured to enclose the transmission assembly, connection between the transmission assembly and the driving assembly, and connection between the transmission assembly and the rotating assembly inside the sealed housing.

Another aspect of the present disclosure provides a magnetron assembly. The magnetron assembly includes: a magnetron; and a magnetron drive mechanism configured to drive the magnetron to rotate at different radii of a first rotation axis, where the magnetron drive mechanism is the disclosed magnetron drive mechanism.

Another aspect of the present disclosure provides a reaction chamber. The reaction chamber includes: a magnetron assembly disposed above a top wall of the reaction chamber, where the magnetron assembly is the disclosed magnetron assembly.

The embodiments of the present disclosure provide the following beneficial effects.

In the technical solutions of the magnetron drive mechanism, the magnetron assembly, and the reaction chamber provided by the embodiments of the present disclosure, the magnetron drive mechanism relies on the driving assembly to drive the rotating assembly and the transmission assembly to rotate clockwise or counterclockwise around the first rotation axis. At the same time, through the transmission assembly, the driving assembly drives the rotating assembly and the magnetron to rotate clockwise or counterclockwise around the second rotation axis. The limiting assembly blocks the rotating assembly from continuing to rotate clockwise or counterclockwise to confine the magnetron to positions at different radii of the first rotation axis. That is, through the switching of the rotation directions of the magnetron, the switching of the magnetron between different regions of the target material is achieved. At the same time, the magnetron drive mechanism provided by the embodiments of the present disclosure is not limited by the shape, the size, etc. of the magnetron, thereby suitable for various types of the magnetron and widening the process window. Moreover, the magnetron drive mechanism does not depend on the factors such as the centrifugal force, the elastic force of the spring, the liquid pressure of the deionized water, etc. Thus, the reliability is improved, and the process difficulty is reduced.

DETAILED DESCRIPTION

To make the foregoing objectives, features and advantages of the present disclosure clearer and more understandable, a magnetron drive mechanism, a magnetron assembly, and a reaction chamber provided by the embodiments of the present disclosure will be further described with reference to the accompanying drawings.

Figure 1:
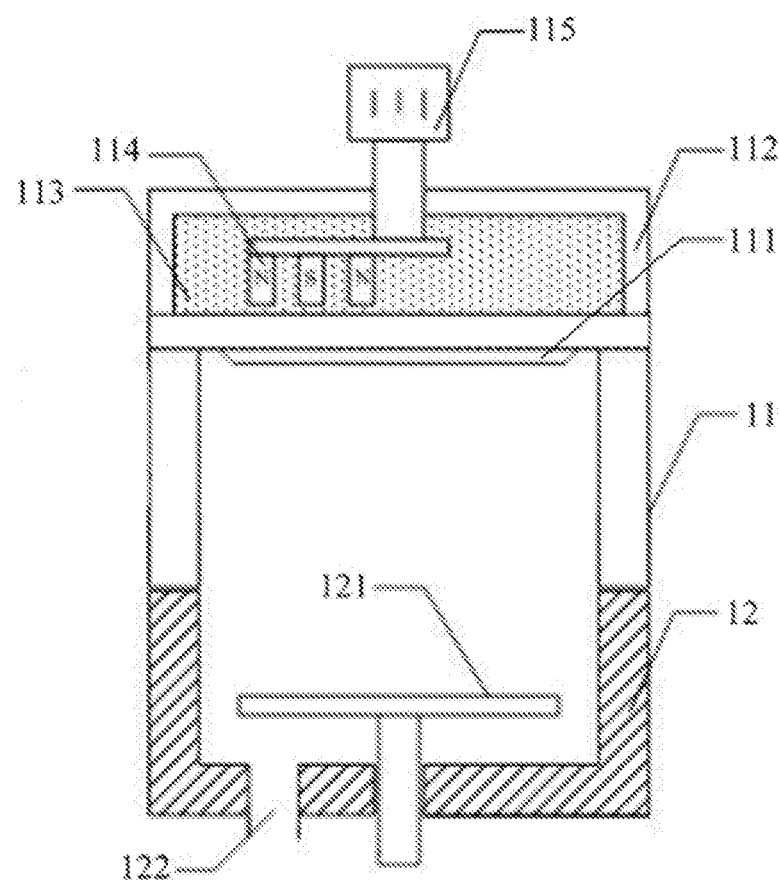
FIG. 1 illustrates a schematic view of a typical self-ionizing sputtering chamber.
Figure 2:
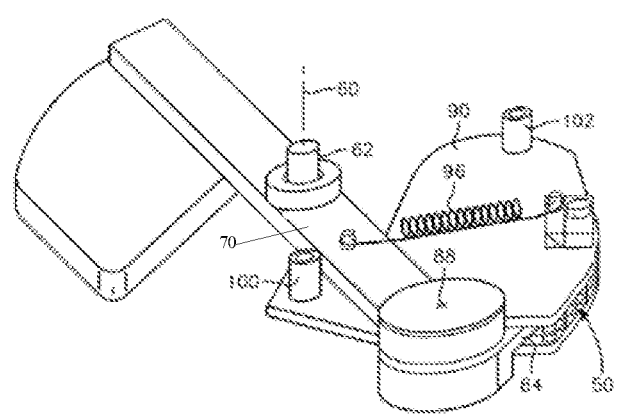
FIG. 2 illustrates a schematic view of an exemplary magnetron assembly in the existing technology.

To achieve the switching of a magnetron between a peripheral region and an inner region of a target material, the existing technology adopts a magnetron drive mechanism as shown in FIG. 2. Referring to FIG. 2, the driven by an electric motor, a rotation shaft 62 rotates around a central axis 60 on the back surface of the target material. A rotating arm 70 is fixed to the rotation shaft 62 and rotates driven by the rotation shaft 62. The magnetron 90 rotates around another central axis 88 relative to the rotating arm 70. The magnetron 90 includes a first limiting member 100, a second limiting member 102, a magnet 50, and a magnet mounting plate 84.

When the electric motor drives the rotation shaft 62 to rotate at a certain high speed, the magnetron 90 overcomes an elastic force of a spring 96 to move to a position as shown in FIG. 2 under the action of a centrifugal force. The position corresponds to the peripheral region of the target material. At this point, the first limiting member 100 contacts with the rotating arm 70 to limit the magnetron 90 to the position. As long as the electric motor rotates at the high speed, the magnetron 90 rotates in the peripheral region of the target material.

When the electric motor drives the rotation shaft 62 to rotate at a certain low speed, the magnetron 90 moves toward the center of the target material under the action of an elastic force of the spring 96 until the magnetron enters the inner region of the target material. At this point, the second limiting member 102 contacts with the rotating arm 70 to limit the magnetron 90 to the position. As long as the electric motor rotates at the low speed, the magnetron 90 rotates in the inner region of the target material.

However, the magnetron assembly as shown in FIG. 2 has the following problems in the practical applications.

First, the magnetron has a limited movement range, and there are strict requirements for the shape and size of the magnetron. Thus, the deposition process is substantially limited by these constraints.

Second, because the switching of the magnetron between the peripheral region and the inner region of the target material is achieved under the action of the combined force of the centrifugal force at different rotation speeds of the electric motor, the elastic force of the spring, and the fluid pressure of the deionized water, too many factors make the adjustment too complicated. For example, if the fluid pressure of the deionized water changes, the centrifugal force or the elastic force needs to be adjusted accordingly to maintain the same combined force. But it requires the adjustment of the electric motor speed or the replacement of the spring, thereby increasing the process difficulty.

Figure 3:
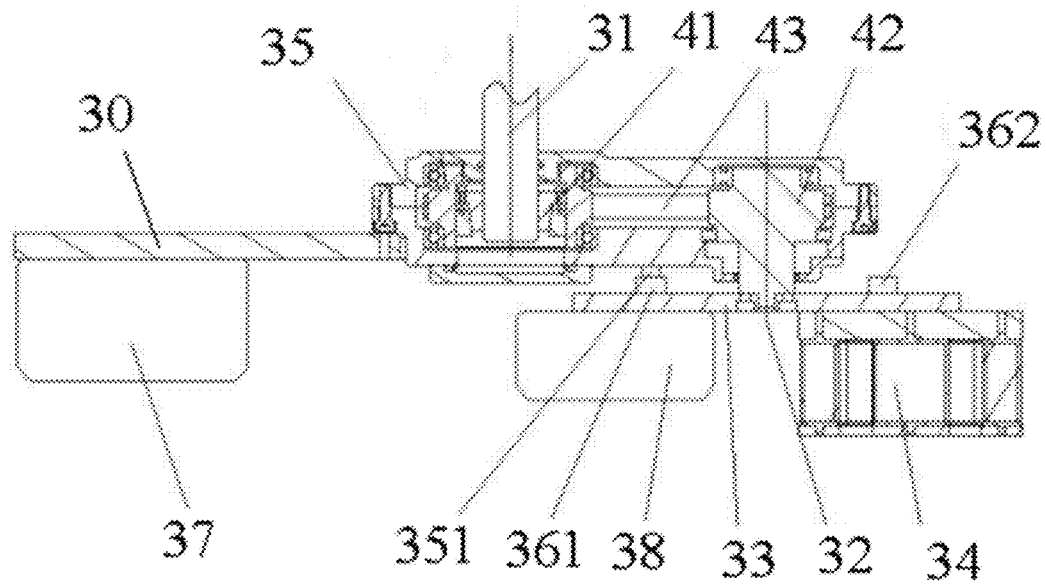
FIG. 3 illustrates a schematic view of an exemplary magnetron drive mechanism according to some embodiments of the present disclosure.
Figure 4:
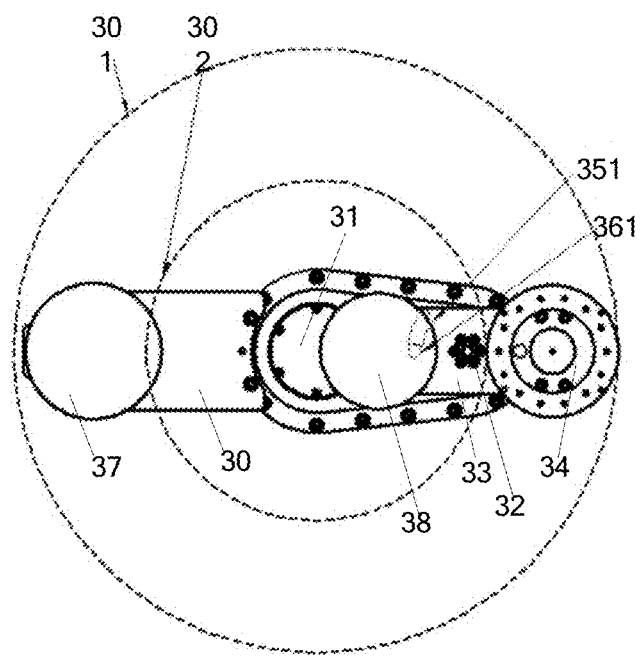
FIG. 4 illustrates a schematic view of an operation state of FIG. 3.
Figure 5:
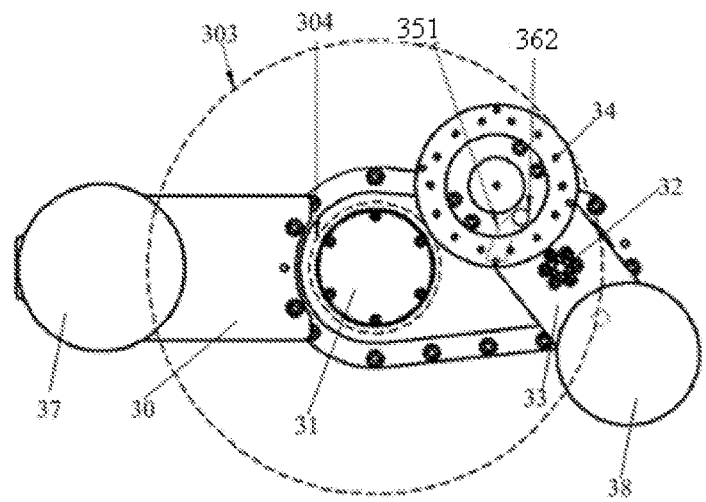
FIG. 5 illustrates a schematic view of another operation state of FIG. 3.

To solve the above problems, referring to FIGS. 3-5, the present disclosure provides a magnetron drive mechanism. The magnetron drive mechanism includes a driving assembly, a transmission assembly, a rotating assembly, and a limiting assembly. The driving assembly drives the rotating assembly and the transmission assembly to rotate clockwise or counterclockwise around a first rotation axis. The rotating assembly is connected to the magnetron. And, through the transmission assembly, the driving assembly drives the rotating assembly and the magnetron to rotate clockwise or counterclockwise around a second rotation axis. The second rotation axis is parallel with the first rotation axis. The limiting assembly is configured to block the rotating assembly from rotating clockwise or counterclockwise to confine the magnetron at different radii of the first rotation axis.

The driving assembly may switch the rotation direction of the magnetron. Assisted by the limiting assembly, the magnetron that rotates in different rotation directions rotates at different radii of the first rotation axis, such that the switching of the magnetron between different regions of the target material is achieved. The magnetron drive mechanism provided by the embodiments of the present disclosure drives the magnetron to rotate in different regions without being limited by the shape, the size, etc. of the magnetron, thereby suitable for various types of the magnetron and widening the process window. Moreover, the magnetron drive mechanism does not depend on the factors such as the centrifugal force, the elastic force of the spring, the liquid pressure of the deionized water, etc. Thus, the reliability is improved, and the process difficulty is reduced.

In one embodiment, the driving assembly includes a drive source (not shown), a first rotating shaft 31, and a first rotating arm 30. The first rotating shaft 31 is connected to the first rotating arm 30. The transmission assembly and the rotating assembly are fixed to the first rotating arm 30. Specifically, the first rotating arm 30 is horizontally disposed. The first rotating shaft 31 is located at a position between two ends of the first rotating arm 30. The rotating assembly is located at one end of the first rotating arm 30. A first counterweight 37 is configured on the other end of the first rotating arm 30 to balance the weight at both ends of the first rotating arm 30. In addition, assisted by the first counterweight 37, changes in the size and shape of the magnetron 34 may not affect the balance of the rotation structure, thereby suitable for various types of the magnetron 34 and widening the process window.

The drive source is configured to drive the first rotating shaft 31 and the first rotating arm 30 to rotate clockwise or counterclockwise around a first rotation axis (i.e., the axis of the first rotating shaft 31). The first rotating shaft 31 is connected to the rotating assembly through the transmission assembly. When the first rotating shaft 31 rotates clockwise or counterclockwise, the transmission assembly drives the rotating assembly and the magnetron to rotate clockwise or counterclockwise around the second rotation axis.

In one embodiment, the rotating assembly includes a second rotating shaft 32 and a second rotating arm 33. The first rotating shaft 31 is connected to the second rotating shaft 32 through the transmission assembly. When the first rotating shaft 31 rotates clockwise or counterclockwise, the second rotating shaft 32 rotates clockwise or counterclockwise around the second rotation axis (i.e., the axis of the second rotating shaft 32). The second rotating arm 33 is connected to the second rotating shaft 32. The magnetron 34 is fixed to the second rotating arm 33. Specifically, the second rotating arm 33 is horizontally disposed. The second rotating shaft 32 is located at a position between two ends of the second rotating arm 33. The magnetron 34 is located at one end of the second rotating arm 33. A second counterweight 38 is configured on the other end of the second rotating arm 33 to balance the weight at both ends of the second rotating arm 33.

When the drive source drives the first rotating shaft 31 and the first rotating arm 30 to rotate clockwise or counterclockwise around the first rotation axis, through the transmission assembly, the first rotating shaft 31 drives the second rotating shaft 32 to rotate clockwise or counterclockwise around the second rotation axis. The second rotating shaft 32 drives the second rotating arm 33 and the magnetron 34 to rotate clockwise or counterclockwise around the second rotation axis.

In one embodiment, the limiting assembly includes a first limiting member 361 and a second limiting member 362 disposed on the second rotating arm 33 and a third limiting member 351 disposed on the first rotating arm 30. As shown in FIG. 4, when the drive source drives the first rotating shaft 31 to rotate clockwise, the first limiting member 361 contacts the third limiting member 351 when the magnetron 34 rotates clockwise to a first radius of the first rotation axis to block the second rotating arm 33 from continuing to rotate, thereby confining the magnetron 34 to the position at the first radius. At this time, the magnetron 34 corresponds to the peripheral region of the target material. That is, the magnetron 34 rotates in an annular area between a dash line 301 and a dash line 302 as shown in FIG. 4. In addition, the first limiting member 361 and the third limiting member 351 at least partially overlap in the direction of the first rotation axis to mutually block each other.

Assisted by the first limiting member 361, the second limiting member 362, and the third limiting member 351, a relatively large vertical gap between the first rotating arm 30 and the second rotating arm 33 may be designed to facilitate installation and disassembling.

As shown in FIG. 5, when the drive source drives the first rotating shaft 31 to rotate counterclockwise, the second limiting member 362 contacts with the third limiting member 351 when the magnetron 34 rotates counterclockwise to a position at a second radius of the first rotation axis to block the second rotating arm 33 from continuing to rotate, thereby confining the magnetron 34 to the position at the second radius. At this time, the magnetron 34 corresponds to the inner region of the target material. That is, the magnetron 34 rotates in an area between a dash line 303 and a dash line 304 as shown in FIG. 5. In addition, the second limiting member 362 and the third limiting member 351 at least partially overlap in the direction of the first rotation axis to mutually block each other.

In practical applications, only the first limiting member 361 and the second limiting member 362 may be configured and the third limiting member 351 may be omitted. In this case, the first limiting member 361 and the second limiting member 362 partially overlap with the first rotating arm 30 in the direction of the first rotation axis to directly contact the first rotating arm 30.

In one embodiment, the limiting assembly further includes a first position adjustment device (not shown) and a second position adjustment device (not shown). The first position adjustment device is configured to adjust the position of the first limiting member 361 and/or the second limiting member 362 on the second rotating arm 33. The second position adjustment device is configured to adjust the position of the third limiting member 351 on the first rotating arm 30.

When the positions of the first limiting member 361, the second limiting member 362, and/or the third limiting member 351 are changed, the position of the magnetron 34 at the radius of the first rotation axis also changes. As such, the position of the magnetron 34 relative the target material can be adjusted to adapt to the target material of different sizes, thereby widening the application scope. Moreover, different annular areas of a same target material may be scanned according to actual requirements. In addition, the positions of the limiting members may be adjusted without dissembling the first limiting member 361, the second limiting member 362, and/or the third limiting member 351, which is convenient and quick to adjust.

In some embodiments, the position adjustment devices may be any structures that can adjust the positions of the limiting members.

In one embodiment, as shown in FIG. 3, the transmission assembly includes a first pulley 41, a second pulley 42, and a synchronous belt 43. The first pulley 41 is mounted on the first rotating shaft 31. The second pulley 42 is mounted on the second rotating shaft 32. The synchronous belt 43 is sleeved on the first pulley 41 and the second pulley 42. When the drive source drives the first rotating shaft 31, the first pulley 41 rotates synchronously with the first rotating shaft 31 and drives the second pulley 42 to rotate through the synchronous belt 43, thereby driving the second rotating shaft 32 to rotate.

Figure 6:
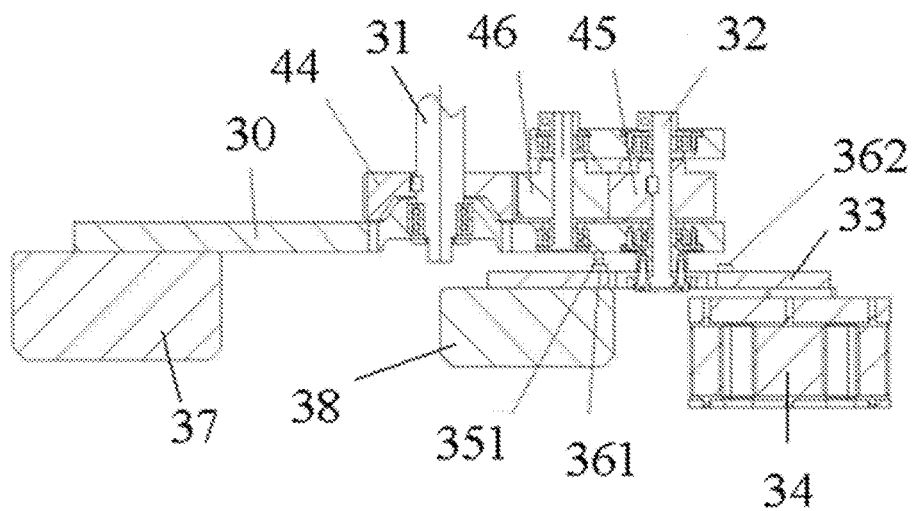
FIG. 6 illustrates a schematic view of another exemplary magnetron drive mechanism according to some embodiments of the present disclosure.

In one embodiment, the transmission assembly adopts a transmission belt structure. But the present disclosure is not limited thereto. In practical applications, the transmission assembly may also adopt a gear transmission structure. Specifically, as shown in FIG. 6, the transmission assembly includes a first gear 44, a second gear 46, and a third gear 45. The first gear 44 is mounted on the first rotating shaft 31. The third gear is mounted on the second rotating shaft 32. The second gear 46 meshes with the first gear 44 and the third gear 45. When the drive source drives the first rotating shaft 31, the power is sequentially transmitted to the second rotating shaft 32 through the first gear 44, the second gear 46, and the third gear 45.

In one embodiment, the magnetron drive mechanism also includes a sealed housing 35 configured to enclose the transmission assembly, connection between the transmission assembly and the driving assembly, and connection between the transmission assembly and the rotating assembly inside the sealed housing 35. Specifically, as shown in FIG. 3, the entire transmission assembly, the connection between the first rotating shaft 31 and the transmission assembly, and the connection between the second rotating shaft 32 and the transmission assembly are enclosed inside the sealed housing 35. During the use of the magnetron, the magnetron is often placed in the deionized water. Protected by the sealed housing 35, the assemblies inside the sealed housing may be prevented from rusting, thereby extending the service life of the magnetron drive mechanism.

When the magnetron drive mechanism includes the first counterweight 37, the counterweight 37 may also be disposed inside the sealed housing 35 to avoid rusting of the counterweight 37 due to exposure to the deionized water.

Another aspect of the present disclosure provides a magnetron assembly. The magnetron assembly includes a magnetron and a magnetron drive mechanism. The magnetron drive mechanism is configured to drive the magnetron to rotate at different radii of a first rotation axis. The magnetron drive mechanism is provided by the embodiments of the present disclosure.

The magnetron assembly provided by the embodiments of the present disclosure includes the disclosed magnetron drive mechanism, which is neither limited by the shape and size of the magnetron nor affected by the factors such as the centrifugal force, the elastic force of the spring, the liquid pressure of the deionized water, etc. Thus, the reliability is improved, and the process difficulty is reduced.

Another aspect of the present disclosure provides a reaction chamber. The reaction chamber includes a magnetron assembly disposed above the top wall of the reaction chamber. The magnetron assembly is provided by the embodiments of the present disclosure.

The reaction chamber provided by the embodiments of the present disclosure includes the disclosed magnetron assembly, which is neither limited by the shape and size of the magnetron nor affected by the factors such as the centrifugal force, the elastic force of the spring, the liquid pressure of the deionized water, etc. Thus, the reliability is improved, and the process difficulty is reduced.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A magnetron drive mechanism, comprising:
a driving assembly configured to drive a rotating assembly and a transmission assembly to rotate clockwise or counterclockwise around a first rotation axis and including a drive source, a first rotating shaft, and a first rotating arm;
the transmission assembly, through which the driving assembly drives the rotating assembly and a magnetron to rotate clockwise or counterclockwise around a second rotation axis, the second rotation axis and the first rotation axis being parallel with each other;
the rotating assembly configured to connect to the magnetron and including a second rotating arm;
a limiting assembly configured to block the rotating assembly from rotating clockwise or counterclockwise to confine the magnetron to positions at different radii of the first rotation axis; and
a sealed housing configured to enclose the transmission assembly, a connection between the transmission assembly and the driving assembly, and a connection between the transmission assembly and the rotating assembly being inside the sealed housing, the sealed housing separating assemblies inside from deionized water in which the magnetron is placed during operation;
wherein the drive source drives the first rotating shaft, the first rotating arm, and the second rotating arm to rotate clockwise or counterclockwise around the first rotation axis, and the first rotating arm and the second rotating arm are driven by one drive source around the first rotation axis.

2. The magnetron drive mechanism according to claim 1, wherein:
the first rotating shaft and the first rotating arm are connected;
the transmission assembly and the rotating assembly are fixed to the first rotating arm; and
the first rotating shaft is connected to the rotating assembly through the transmission assembly.

3. The magnetron drive mechanism according to claim 2, wherein:
the rotating assembly includes a second rotating shaft;
the first rotating shaft is connected to the second rotating shaft through the transmission assembly;
when the first rotating shaft rotates clockwise or counterclockwise, the second rotating shaft rotates clockwise or counterclockwise around the second rotation axis; and
the second rotating arm and the second rotating shaft are connected and the magnetron is fixed to the second rotating arm.

4. The magnetron drive mechanism according to claim 3, wherein:
the limiting assembly includes a first limiting member and a second limiting member disposed on the second rotating arm;
when the drive source drives the first rotating shaft to rotate clockwise, the first limiting member contacts the first rotating arm to block the second rotating arm from continuing to rotate when the magnetron rotates clockwise to a position at a first radius of the first rotation axis; and
when the drive source drives the first rotating shaft to rotate counterclockwise, the second limiting member contacts the first rotating arm to block the second rotating arm from continuing to rotate when the magnetron rotates counterclockwise to a position at a second radius of the first rotation axis.

5. The magnetron drive mechanism according to claim 4, wherein:
the limiting assembly further includes a third limiting member disposed on the first rotating arm;
when the drive source drives the first rotating shaft to rotate clockwise, the first limiting member contacts with the third limiting member to block the second rotating arm from continuing to rotate when the magnetron rotates clockwise to the position at the first radius of the first rotation axis; and
when the drive source drives the first rotating shaft to rotate counterclockwise, the second limiting member contacts with the third limiting member to block the second rotating arm from continuing to rotate when the magnetron rotates counterclockwise to the position at the second radius of the first rotation axis.

6. The magnetron drive mechanism according to claim 5, wherein:
the limiting assembly further includes a first position adjustment device and a second position adjustment device;
the first position adjustment device is configured to adjust the position of the first limiting member and/or the second limiting member on the second rotating arm; and
the second position adjustment device is configured to adjust the position of the third limiting member on the first rotating arm.

7. The magnetron drive mechanism according to claim 3, wherein:
the transmission assembly includes a first pulley, a second pulley, and a synchronous belt;
the first pulley is mounted on the first rotating shaft;
the second pulley is mounted on the second rotating shaft; and
the synchronous belt is sleeved on the first pulley and the second pulley.

8. The magnetron drive mechanism according to claim 3, wherein:
the transmission assembly includes a first gear, a second gear, and a third gear;
the first gear is mounted on the first rotating shaft;
the third gear is mounted on the second rotating shaft; and
the second gear meshes with the first gear and the third gear.

9. A magnetron assembly, comprising:
a magnetron; and
a magnetron drive mechanism configured to drive the magnetron to rotate at different radii of a first rotation axis, the magnetron drive mechanism comprising:
a driving assembly configured to drive a rotating assembly and a transmission assembly to rotate clockwise or counterclockwise around a first rotation axis and including a drive source, a first rotating shaft, and a first rotating arm;
the transmission assembly, through which the driving assembly drives the rotating assembly and a magnetron to rotate clockwise or counterclockwise around a second rotation axis, the second rotation axis and the first rotation axis being parallel with each other;

the rotating assembly configured to connect to the magnetron and including a second rotating arm;

a limiting assembly configured to block the rotating assembly from rotating clockwise or counterclockwise to confine the magnetron to positions at different radii of the first rotation axis; and a sealed housing configured to enclose the transmission assembly, a connection between the transmission assembly and the driving assembly, and a connection between the transmission assembly and the rotating assembly being inside the sealed housing, the sealed housing separating assemblies inside from deionized water in which the magnetron is placed during operation;

wherein the drive source drives the first rotating shaft, the first rotating arm, and the second rotating arm to rotate clockwise or counterclockwise around the first rotation axis, and the first rotating arm and the second rotating arm are driven by one drive source around the first rotation axis.

10. The magnetron assembly according to claim 9, wherein:

the first rotating shaft and the first rotating arm are connected;

the transmission assembly and the rotating assembly are fixed to the first rotating arm; and the first rotating shaft is connected to the rotating assembly through the transmission assembly.

11. The magnetron assembly according to claim 10, wherein:

the rotating assembly includes a second rotating shaft;

the first rotating shaft is connected to the second rotating shaft through the transmission assembly;

when the first rotating shaft rotates clockwise or counterclockwise, the second rotating shaft rotates clockwise or counterclockwise around the second rotation axis; and the second rotating arm and the second rotating shaft are connected and the magnetron is fixed to the second rotating arm.

12. The magnetron assembly according to claim 11, wherein:

the limiting assembly includes a first limiting member and a second limiting member disposed on the second rotating arm;

when the drive source drives the first rotating shaft to rotate clockwise, the first limiting member contacts the first rotating arm to block the second rotating arm from continuing to rotate when the magnetron rotates clockwise to a position at a first radius of the first rotation axis; and when the drive source drives the first rotating shaft to rotate counterclockwise, the second limiting member contacts the first rotating arm to block the second rotating arm from continuing to rotate when the magnetron rotates counterclockwise to a position at a second radius of the first rotation axis.

13. A reaction chamber, comprising: a magnetron assembly disposed above a top wall of the reaction chamber, wherein the magnetron assembly comprising:

a magnetron; and a magnetron drive mechanism configured to drive the magnetron to rotate at different radii of a first rotation axis, the magnetron drive mechanism comprising:

a driving assembly configured to drive a rotating assembly and a transmission assembly to rotate clockwise or counterclockwise around a first rotation axis and including a drive source, a first rotating shaft, and a first rotating arm;

the transmission assembly, through which the driving assembly drives the rotating assembly and a magnetron to rotate clockwise or counterclockwise around a second rotation axis, the second rotation axis and the first rotation axis being parallel with each other;

the rotating assembly configured to connect to the magnetron and including a second rotating arm; and a limiting assembly configured to block the rotating assembly from rotating clockwise or counterclockwise to confine the magnetron to positions at different radii of the first rotation axis; and a sealed housing configured to enclose the transmission assembly, a connection between the transmission assembly and the driving assembly, and a connection between the transmission assembly and the rotating assembly being inside the sealed housing, the sealed housing separating assemblies inside from deionized water in which the magnetron is placed during operation;

wherein the drive source drives the first rotating shaft, the first rotating arm, and the second rotating arm to rotate clockwise or counterclockwise around the first rotation axis, and the first rotating arm and the second rotating arm are driven by one drive source around the first rotation axis.

14. The reaction chamber according to claim 13, wherein:

the first rotating shaft and the first rotating arm are connected;

the transmission assembly and the rotating assembly are fixed to the first rotating arm; and the first rotating shaft is connected to the rotating assembly through the transmission assembly.

15. The reaction chamber according to claim 14, wherein:

the rotating assembly includes a second rotating shaft;

the first rotating shaft is connected to the second rotating shaft through the transmission assembly;

when the first rotating shaft rotates clockwise or counterclockwise, the second rotating shaft rotates clockwise or counterclockwise around the second rotation axis; and the second rotating arm and the second rotating shaft are connected and the magnetron is fixed to the second rotating arm.

16. The reaction chamber according to claim 15, wherein:

the limiting assembly includes a first limiting member and a second limiting member disposed on the second rotating arm;

when the drive source drives the first rotating shaft to rotate clockwise, the first limiting member contacts the first rotating arm to block the second rotating arm from continuing to rotate when the magnetron rotates clockwise to a position at a first radius of the first rotation axis; and when the drive source drives the first rotating shaft to rotate counterclockwise, the second limiting member contacts the first rotating arm to block the second rotating arm from continuing to rotate when the magnetron rotates counterclockwise to a position at a second radius of the first rotation axis.

17. The reaction chamber according to claim 15, wherein:

the transmission assembly includes a first pulley, a second pulley, and a synchronous belt;

the first pulley is mounted on the first rotating shaft;
the second pulley is mounted on the second rotating shaft; and
the synchronous belt is sleeved on the first pulley and the second pulley.

18. The reaction chamber according to claim 15, wherein:
the transmission assembly includes a first gear, a second gear, and a third gear;
the first gear is mounted on the first rotating shaft;
the third gear is mounted on the second rotating shaft; and
the second gear meshes with the first gear and the third gear.

\* \* \* \* \*